(12) United States Patent
Kwon et al.

(10) Patent No.: US 12,453,143 B2
(45) Date of Patent: Oct. 21, 2025

(54) QUANTUM DOTS AND DEVICES INCLUDING THE SAME

(71) Applicant: SAMSUNG ELECTRONICS CO., LTD., Suwon-si (KR)

(72) Inventors: Soo Kyung Kwon, Suwon-si (KR); Yongwook Kim, Yongin-si (KR); Eun Joo Jang, Suwon-si (KR); Jihyun Min, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 228 days.

(21) Appl. No.: 17/186,077

(22) Filed: Feb. 26, 2021

(65) Prior Publication Data

US 2021/0183999 A1 Jun. 17, 2021

Related U.S. Application Data

(63) Continuation of application No. 15/659,758, filed on Jul. 26, 2017, now Pat. No. 11,355,583.

(30) Foreign Application Priority Data

Jul. 28, 2016 (KR) .................. 10-2016-0096142
Apr. 11, 2017 (KR) .................. 10-2017-0046687

(51) Int. Cl.
*H10F 77/14* (2025.01)
*C09K 11/02* (2006.01)
(Continued)

(52) U.S. Cl.
CPC ............ *H10D 62/118* (2025.01); *C09K 11/02* (2013.01); *C09K 11/70* (2013.01);
(Continued)

(58) Field of Classification Search
CPC ........... H01L 29/0665; H01L 31/02725; H01L 31/035218; H01L 33/18; B82Y 10/00;
(Continued)

(56) References Cited

U.S. PATENT DOCUMENTS 8,957,401 B2 2/2015 Pickett et al.
9,169,435 B2 10/2015 Guo et al.
(Continued)

FOREIGN PATENT DOCUMENTS

CN 102668143 A 9/2012
CN 104512860 A 4/2015
(Continued)

OTHER PUBLICATIONS

Sou et al., "ZnS-based visible-blind UV detectors: effects of isoelectric traps," J. of Elec. Mat., vol. 29, No. 6, pp. 723-726, 2000.
(Continued)

*Primary Examiner* — Meiya Li
(74) *Attorney, Agent, or Firm* — CANTOR COLBURN LLP

(57) ABSTRACT

A quantum dot includes: a core including a first semiconductor nanocrystal, and a shell disposed on the core, the shell including a second semiconductor nanocrystal and a dopant, wherein the first semiconductor nanocrystal includes a Group III-V compound, the second semiconductor nanocrystal includes zinc (Zn), sulfur (S), and selenium, and the dopant includes lithium, a Group 2A metal having an effective ionic radius less than an effective ionic radius of $Zn^{2+}$, a Group 3A element having an effective ionic radius less than an effective ionic radius of $Zn^{2+}$, or a combination thereof. Also a method of producing the quantum dot, and a composite, and an electronic device including the quantum dot.

20 Claims, 6 Drawing Sheets

(51) Int. Cl.
  *C09K 11/70* (2006.01)
  *H10D 62/10* (2025.01)
  *H10F 77/121* (2025.01)
  *H10H 20/818* (2025.01)
  *B82Y 10/00* (2011.01)
  *B82Y 40/00* (2011.01)

(52) U.S. Cl.
  CPC ..... *H10F 77/1215* (2025.01); *H10F 77/1433* (2025.01); *H10H 20/818* (2025.01); *B82Y 10/00* (2013.01); *B82Y 40/00* (2013.01)

(58) Field of Classification Search
  CPC ......... B82Y 40/00; C09K 11/02; C09K 11/70; H10D 62/118; H10F 77/1215; H10F 77/1433; H10H 20/818
  See application file for complete search history.

(56) References Cited

U.S. PATENT DOCUMENTS

| | | |
|---|---|---|
| 9,181,472 B2 | 11/2015 | Bartel |
| 9,412,916 B2 | 8/2016 | Xu et al. |
| 9,537,059 B2 | 1/2017 | Xu et al. |
| 9,631,141 B2 | 4/2017 | Guo et al. |
| 9,685,583 B2 | 6/2017 | Guo et al. |
| 9,884,993 B2 | 2/2018 | Guo et al. |
| 10,032,964 B2 | 7/2018 | Pickett et al. |
| 10,179,876 B2 | 1/2019 | Jun et al. |
| 10,217,908 B2 | 2/2019 | Naasani et al. |
| 10,312,418 B2 | 6/2019 | Naasani et al. |
| 10,377,946 B2 | 8/2019 | Li et al. |
| 10,644,207 B2 | 5/2020 | Naasani et al. |
| 10,707,371 B2 | 7/2020 | Guo et al. |
| 2008/0305334 A1 | 12/2008 | Jang et al. |
| 2010/0110728 A1* | 5/2010 | Dubrow .................. G02B 1/10 252/301.36 |
| 2012/0001217 A1 | 1/2012 | Kang et al. |
| 2012/0195335 A1 | 8/2012 | Kalosha et al. |
| 2013/0140518 A1 | 6/2013 | Jain et al. |
| 2014/0117292 A1* | 5/2014 | Jun ....................... H10F 77/124 252/519.14 |
| 2014/0185640 A1 | 7/2014 | Jain |
| 2015/0194577 A1 | 7/2015 | Glarvey et al. |
| 2017/0088775 A1 | 3/2017 | Park et al. |
| 2017/0110633 A1 | 4/2017 | Xu et al. |
| 2017/0306227 A1 | 10/2017 | Ippen et al. |
| 2018/0094190 A1 | 4/2018 | Kim et al. |
| 2018/0273839 A1* | 9/2018 | Li ........................ C09K 11/025 |
| 2019/0062628 A1 | 2/2019 | Bartel |

FOREIGN PATENT DOCUMENTS

| | | |
|---|---|---|
| CN | 104520228 A | 4/2015 |
| CN | 104818019 A | 8/2015 |
| CN | 105670631 A | 6/2016 |
| EP | 2905321 A1 | 8/2015 |
| KR | 1020080107578 A | 12/2008 |
| KR | 1020120099704 A | 9/2012 |
| KR | 1020130055058 A | 5/2013 |
| KR | 1020140056500 A | 5/2014 |
| KR | 1020140064996 A | 5/2014 |
| KR | 101537296 B1 | 7/2015 |
| KR | 1020170036557 A | 4/2017 |
| RU | 2387062 C1 | 4/2010 |
| TW | 201317325 A | 5/2013 |
| WO | 2009025913 A2 | 2/2009 |
| WO | 2013057702 A1 | 4/2013 |
| WO | 2015082940 A1 | 6/2015 |

OTHER PUBLICATIONS

Bear et al., "Doping Group IIB Metal Ions into Quantum Dot Shells via the One-Pot decomposition of Metal-Dithiocarbamates", Adv. Optical Mater., 3, 2015, pp. 704-712.

Cooper et al., "Tunable Photoluminescent Core/Shell Cu+-Doped ZnSe/ZnS Quantum Dots Codoped with Al3+, Ga3+, or In3+", ACS Appl. Mater. Interfaces, 7, 2015, pp. 10055-10066.

European Search Report for European Patent Application No. 17183404.7 dated Jan. 3, 2018.

Gul et al., 'Effect of AL3+ Co-Doping On the Dopant Local Structure, Optical Properties, and Exciton Dynamics in Cu+-Doped ZnSe Nanocrystals', ACS Nano 2013, 7, 8680-8692, 2013.

Ippen et al., "InP/ZnSe/ZnS: A Novel Multishell System for InP Quantum Dots for Improved Luminescence Efficiency and Its application in a Light-Emitting Device", Journal of Information Display, vol. 13, No. 2, Jun. 2012, pp. 91-95.

Kim et al., "Increased shell thickness in indium phosphide multishell quantum dots leading to efficiency and stability enhancement in light-emitting diodes", Optical Materials Express, vol. 4, No. 4, Jul. 1, 2014, 1-8.

Korean Office Action for Korean Patent Application No. 10-2017-0096201 dated Jun. 5, 2018.

Korean Office Action for Korean Patent Application No. 10-2017-0096201 dated Nov. 29, 2018.

R. D. Shannon, "Revised Effective Ionic Radii and Systematic Studies of Interatomic Distances in Halides and Chalcogenides", Acta Cryst. A32, 1976, 751.

Reddy et al., "Effect of Al doping on the structural, optical and photoluminescence properties of ZnS nanoparticles", Journal of Alloys and compounds, 582, 2014, 257-264.

Yang et al., "A bright cadmium-free, hybrid organic/quantum dot white light-emitting diode", Applied Physics Letters, 101, 2012, 233110-1-233110-4.

Office Action dated Dec. 29, 2021, of the corresponding Chinese Patent Application No. 201710628516.4.

Tiong-Palisoc, S., "Emission and excitation spectral of ZnSexS1-x single crystals", Philippine J. of Sci., 129(2), pp. 61-75, Dec. 2000.

Tiong-Palisoc, "Emission and excitation spectral of ZnSexS1-x single crystals", Philippine J. of Sci., 129 (2): 61-75 (Year: 2000).

Jong-Hoon Kim, et al., Enhanced fluorescent stability of copper indium sulfide quantum dots through incorporating aluminum into ZnS shell, Journal of Alloys and Compounds 662 (2016) 173-178.

Pinhua Rao, et al., Highly stable CuInS2@ZnS:Al core@shell quantum dots: the role of aluminium self-passivation, Chem. Commun., 2015, 51, 8757-8760.

* cited by examiner

QUANTUM DOTS AND DEVICES INCLUDING THE SAME

CROSS-REFERENCE TO RELATED APPLICATIONS

This application is a continuation of U.S. patent application Ser. No. 15/659,758, filed on Jul. 26, 2017, which claims priority to and the benefit of Korean Patent Application Nos. 10-2016-0096142 and 10-2017-0046687, filed in the Korean Intellectual Property Office on Jul. 28, 2016 and Apr. 11, 2017, respectively, and all the benefits accruing therefrom under 35 U.S.C. § 119, the contents of which in their entirety are herein incorporated by reference.

BACKGROUND

1. Field

Quantum dots and devices including the same are disclosed.

2. Description of the Related Art

Unlike bulk materials, nanoparticles may have physical characteristics (e.g., bandgap energies and melting points) that are known as intrinsic characteristics, but may be controlled by changing a size thereof. For example, a semiconductor nanocrystal particle (also known as a quantum dot) is a type of a semiconductor material having a crystalline structure with a size of several nanometers. Due to its extremely small size, the quantum dot has a large surface area per unit volume and may exhibit a quantum confinement effect, thereby showing physical and chemical properties different from those of a bulk material having the identical composition.

SUMMARY

An embodiment provides a quantum dot (e.g., an environmentally-friendly quantum dot) having improved light-emitting properties and thermal stability.

Another embodiment provides a method of producing the quantum dot.

Yet another embodiment provides a quantum dot polymer composite including the quantum dots.

Still another embodiment provides an electronic device including the quantum dot.

In an embodiment, a quantum dot includes: a core including a first semiconductor nanocrystal, and a shell disposed on the core, the shell including a second semiconductor nanocrystal and a dopant,
wherein the first semiconductor nanocrystal includes a Group III-V compound, and the second semiconductor nanocrystal includes zinc (Zn), selenium (Se), and sulfur (S), and
wherein the dopant includes lithium, a Group 2A metal having an effective ionic radius less than an effective ionic radius of $Zn^{2+}$, a Group 3A element having an effective ionic radius less than an effective ionic radius of $Zn^{2+}$, or a combination thereof.

The Group III-V compound may further include a Group II metal, a Group IV element, or a combination thereof.

The first semiconductor nanocrystal may further include a Group II-VI compound, a Group IV-VI compound, a Group compound, a Group I-II-IV-VI compound, or a combination thereof.

The first semiconductor nanocrystal may include InP, InZnP, or a combination thereof.

In the shell or in the quantum dot, a molar ratio of sulfur with respect to selenium may be greater than or equal to about 1 (e.g., greater than 1).

The shell may be a multi-layered shell including at least two shell layers and adjacent two layers of the at least two shell layers may have different compositions from each other.

The shell may have an outermost layer including ZnS.

The quantum dot may have a layer including a third semiconductor nanocrystal disposed directly on the core.

A bandgap energy of the third semiconductor nanocrystal may be greater than a bandgap energy of the first semiconductor nanocrystal and less than a bandgap energy of the second semiconductor nanocrystal.

The third semiconductor nanocrystal may include ZnSe, ZnTe, or a combination thereof.

In the shell, a molar ratio of sulfur with respect to selenium may vary in a radial direction.

The dopant may include aluminum (Al), lithium (Li), gallium (Ga), beryllium (Be), magnesium (Mg), boron (B), or a combination thereof.

A content of the dopant may be less than or equal to about 0.3 mole for example, less than or equal to about 0.2 mole, or less than or equal to about 0.1 mole with respect to one mole of Zn.

The quantum dot may have a full width at half maximum (FWHM) of less than or equal to about 40 nm.

The quantum dot may have a quantum yield of greater than or equal to about 72%, for example, greater than or equal to about 80%.

In another embodiment, a method of producing the quantum dot includes:
providing a mixture including a particle having a core including a first semiconductor nanocrystal, a first shell precursor including zinc, a second shell precursor including sulfur, a third shell precursor including selenium, an organic ligand, a solvent, and a dopant precursor including a dopant; and
heating the mixture to a reaction temperature to form a shell including a second semiconductor nanocrystal and a dopant on the particle (e.g., thereby producing the quantum dot),
wherein the dopant includes lithium, a Group 2A metal having an effective ionic radius less than an effective ionic radius of $Zn^{2+}$, a Group 3A element having an effective ionic radius less than an effective ionic radius of $Zn^{2+}$, or a combination thereof.

The providing of the mixture may include forming a shell layer including a third semiconductor nanocrystal having a different composition from the second semiconductor nanocrystal and not including the dopant directly on the core.

The dopant precursor may include an oleate, a stearate, a chloride, an octanoate, a hydride, an isopropoxide, a palmitate, an organoborane, or a combination thereof.

The dopant may include aluminum (Al), lithium (Li), gallium (Ga), beryllium (Be), magnesium (Mg), boron (B), or a combination thereof.

The dopant precursor may include aluminum oleate, aluminummono stearate, aluminum chloride, aluminum octanoate, aluminum isopropoxide, lithium palmitate, lithium octanoate, magnesium stearate, magnesium oleate, magnesium (isopropyl) chloride, borane, triethylborane, gallium oleate, or a combination thereof.

In the mixture, a molar content of the sulfur may be greater than a molar content of selenium.

The mixture may further include ionic liquid.

In another embodiment, a quantum dot polymer composite includes a polymer matrix; and the quantum dot disposed in the polymer matrix.

The polymer matrix may include a thiol-ene polymer, a (meth)acrylate-based polymer, a urethane polymer, an epoxy polymer, a vinyl-based polymer, a silicone polymer, or a combination thereof.

Another embodiment provides an electronic device including the quantum dot.

The quantum dot of the foregoing embodiments may have enhanced luminous properties. The quantum dot of the foregoing embodiments may show improved heat stability.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
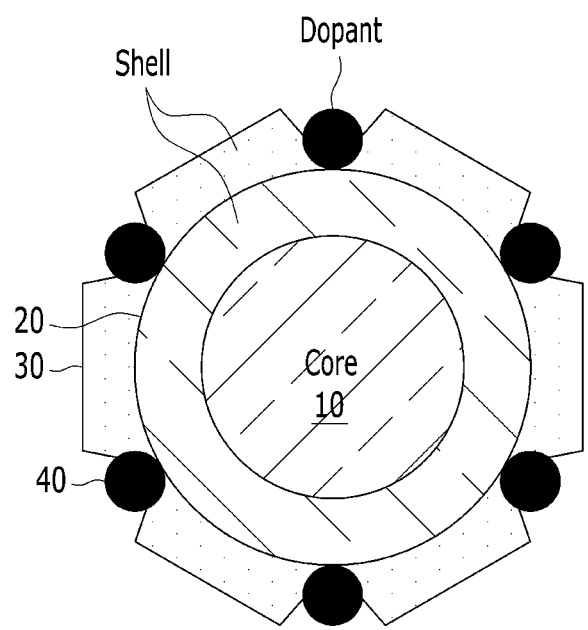
FIG. 1 schematically illustrates an embodiment of a hypothetical mechanism for forming the outermost layer including the additional metals in an embodiment of a quantum dot.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "metal" refers to a metal element and a semi-metal element (e.g., Si or B).

As used herein, "alkyl" refers to a linear or branched saturated monovalent hydrocarbon group (e.g., methyl or hexyl).

As used herein, "alkenyl" refers to a linear or branched monovalent hydrocarbon group having at least one carbon-carbon double bond.

As used herein, "aryl" refers to a monovalent group (e.g., phenyl or naphthyl) formed by removal of one hydrogen atom from at least one aromatic ring.

As used herein, "Group" refers to a Group of the Periodic Table.

As used herein, "Group II" or "Group 2" refers to Group IIA (or 2A) and Group IIB (or 2B), and examples of Group II (Group 2) metals include Cd, Zn, Hg, and Mg, but are not limited thereto.

"Group III" or "Group 3" refers to a Group IIIA (or 3A) and a Group IIIB (or 3B), and examples of the Group III (Group 3) metal may include Al, In, Ga, and TI, but are not limited thereto.

"Group IV" refers to a Group IVA and a Group IVB, and examples of the Group IV metal may include Si, Ge, and Sn but are not limited thereto.

"Group I" refers to a Group IA and a Group IB, and may include Li, Na, K, Ru, and Cs but are not limited thereto.

As used herein, "doping" refers to including a dopant in a crystal structure without imparting any substantial changes in the original crystal structure thereof. For example, a dopant atom may be substituted into a given crystal structure or may be present at an interstitial space. The dopant element may not exhibit any substantial crystalline peak in an X-ray diffraction spectrum. The presence (and/or the content) of dopant element may be confirmed by an X ray photoelectron spectroscopy, an energy dispersive X ray spectroscopy, ICP-AES, or TOF-SIMS.

As used herein, when a definition is not otherwise provided, the term "substituted" refers to a group or compound wherein at least one of the hydrogen atoms thereof is substituted with a 01 to C30 alkyl group, a C2 to C30 alkynyl group, a C6 to C30 aryl group, a C7 to C30 alkylaryl group, a 01 to C30 alkoxy group, a 01 to C30 heteroalkyl group, a C3 to C30 heteroalkylaryl group, a C3 to C30 cycloalkyl group, a C3 to C15 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Further, the singular includes the plural unless mentioned otherwise.

A quantum dot may absorb light from an excitation source and be excited, and may emit energy (e.g., light) corresponding to its bandgap energy. The bandgap energy of the quantum dot may be adjusted by controlling the size and/or the composition of the nanocrystal, and the quantum dot may have photoluminescence characteristics of high color purity. Therefore, various applications to a display element, an energy device, a bio-light emitting element, or the like have been researched for the semiconductor nanocrystals. For a quantum dot having a core-sell structure, passivation by a shell may result in enhanced luminous efficiency. However, most of the practically available core-shell type quantum dots include cadmium in the core thereof. As the cadmium is one of the most harmful elements, there still remains a need to develop a quantum dot not including cadmium while showing an enhanced level of luminous properties. In addition, most of the core-shell type quantum dots may have various defects that occur during the formation of the shell and thus have an adverse effect on the luminous properties thereof.

In an embodiment, a quantum dot has a core-shell structure including a core including a first semiconductor nanocrystal, and a shell disposed on the core. The shell includes a second semiconductor nanocrystal and a dopant. The second semiconductor nanocrystal may have a different composition from the first semiconductor nanocrystal.

The second semiconductor nanocrystal may have a bandgap greater than that of the first semiconductor nanocrystal. In an embodiment or in a preferred embodiment the quantum dot does not include cadmium.

The first semiconductor nanocrystal includes a first metal and a first non-metal. In an embodiment, the first semiconductor nanocrystal may include a Group III-V compound. The first metal may further include a Group II metal, a Group IV metal, or a combination thereof. The first non-metal may include a Group V element, a Group VI element, or a combination thereof. In an embodiment, the first semiconductor nanocrystal may further include a Group II metal (e.g., zinc), except cadmium, or a combination thereof. In an embodiment, the core does not include copper.

For example, the first semiconductor nanocrystal may further include a Group II-VI compound, a Group IV-VI compound, a Group IV element or compound, a Group compound, a Group I-II-IV-VI compound, or a combination thereof. In an embodiment, the first semiconductor nanocrystal may include InP, InZnP, or a combination thereof.

The shell includes the second semiconductor nanocrystal and the dopant. The second semiconductor nanocrystal has a different composition from the first semiconductor nanocrystal, and includes zinc (Zn), selenium (Se), and sulfur (S). The dopant may include lithium, a Group 2A metal (e.g., beryllium or magnesium) having a smaller effective ionic radius than an effective ionic radius of $Zn^{2+}$, a Group 3A metal or semimetal (e.g., aluminum or gallium) having a smaller ionic radius than an effective ionic radius of an $Zn^{2+}$, or a combination thereof. In an embodiment, the second semiconductor nanocrystal may be doped with the dopant. In the shell, a ratio (e.g. a molar ratio) of sulfur with respect to selenium may be greater than or equal to about 1 or greater than 1. For example, the second semiconductor nanocrystal may include a ternary compound such as ZnSeS. In the second semiconductor nanocrystal, the content of sulfur may be greater than that of selenium.

The shell may further include a crystalline or amorphous material. The crystalline or amorphous material included in the shell may include a Group II-VI compound, a Group III-V compound, a Group IV-VI compound, a Group IV element or compound, a metal-containing halogen compound, metal oxide, or a combination thereof.

In an embodiment, the shell may be a multi-layered shell having at least two layers, for example, 2, 3, 4, 5, or more layers, e.g., a first shell layer and a second shell layer. Each layer of the shell may have a composition that may be the same or different from each other. Adjacent shell layers may have compositions different from each other. For example, for a first shell layer and a second shell layer adjacent the first shell layer, a composition of the first shell layer may be different than a composition of the second shell layer. The material of each layer may include a single composition or a combination of two or more materials (e.g., an alloy). At least one element of the materials in each layer may have a concentration gradient changing in a radial direction. For example, at least one layer may have a concentration gradient of the combination of two or more materials (e.g., may include an alloy gradient). The layer including a combination of two or more materials such as an alloy may include a homogeneous composition (e.g. a homogeneous alloy). The layer having a concentration gradient of the combination of two or more materials (e.g., including the alloy gradient) may have a heterogeneous alloy composition, wherein the composition changes in a radial direction.

In an embodiment, the shell may be a multi-layered shell. The outermost shell of the multi-layered shell may include ZnS. In an embodiment, the shell may have a composition varying with the radius. In the shell, a molar ratio of sulfur with respect to selenium may be greater than or equal to about 1 or greater than 1. In the shell, the molar ratio of sulfur with respect to selenium may continuously increase in a radial direction. In an embodiment, a surface of the shell does not include selenium.

In an embodiment, the quantum dot may have a layer including a third semiconductor nanocrystal directly on the core. A bandgap energy of the third semiconductor nanocrystal may be greater than a bandgap energy of the core and less than a bandgap energy of the second semiconductor nanocrystal. The third semiconductor nanocrystal may include ZnSe, ZnSeS (Se rich), ZnTe, or a combination thereof.

Figure 3:
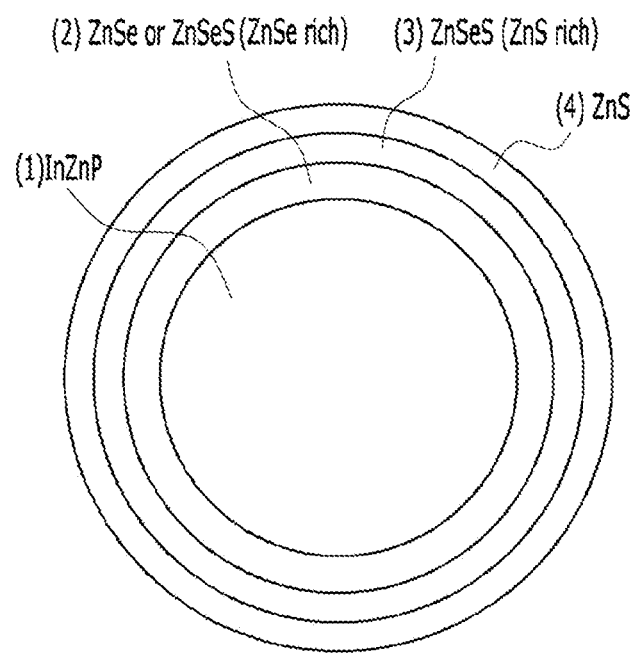
FIG. 3 is a schematic view showing a cross-section of an embodiment of the quantum dot.

Referring to FIG. 3, in an embodiment, the quantum dot includes an InZnP core and a multi-layered shell disposed on the core. In an embodiment, the first layer directly on the core may include ZnSe or (a selenium-rich) ZnSeS (e.g., including selenium in an amount greater than that of sulfur), the second layer disposed between the first layer and the outermost layer may include (a sulfur-rich) ZnSeS (e.g., including sulfur in an amount greater than that of selenium). In the shell, the dopant may be included in the first layer, the second layer and/or the outermost layer. A mole ratio of the sulfur with respect to the selenium in the quantum dot may change (e.g., increase) in a radial direction.

The Group II-VI compound may comprise a binary element compound comprising CdSe, CdTe, ZnS, ZnSe, ZnTe, ZnO, HgS, HgSe, HgTe, MgSe, MgS, or a combination thereof; a ternary element compound comprising CdSeS, CdSeTe, CdSTe, ZnSeS, ZnSeTe, ZnSTe, HgSeS, HgSeTe, HgSTe, HgZnS, HgZnSe, HgZnTe, MgZnSe, MgZnS, CdZnS, CdZnSe, CdZnTe, CdHgS, CdHgSe, CdHgTe, or a combination thereof; and a quaternary element compound comprising HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto.

The Group III-V compound may comprise a binary element compound comprising GaN, GaP, GaAs, GaSb, AlN, AlP, AlAs, AlSb, InN, InP, InAs, InSb, or a combination thereof; a ternary element compound comprising GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound comprising GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. For example, the Group III-V compound may further include a Group II metal. For example, the Group III-V compound may include InZnP.

The Group IV-VI compound may comprise a binary element compound comprising SnS, SnSe, SnTe, PbS, PbSe, PbTe, or a combination thereof; a ternary element compound comprising SnSeS, SnSeTe, SnSTe, PbSeS, PbSeTe, PbSTe, SnPbS, SnPbSe, SnPbTe, or a combination thereof; and a quaternary element compound comprising SnPbSSe, SnPbSeTe, SnPbSTe, or a combination thereof, but is not limited thereto.

The Group compound may comprise $CuInSe_2$, $CuInS_2$, CuInGaSe, CuInGaS, or a combination thereof, but is not limited thereto.

The Group compound may comprise ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof, but is not limited thereto.

The Group I-II-IV-VI compound may comprise CuZnSnSe and CuZnSnS, but is not limited thereto.

The Group IV element or compound may include an elementary substance comprising Si, Ge, or a combination thereof; and a binary element compound comprising SiC, SiGe, or a combination thereof, but is not limited thereto.

The binary element compound, the ternary element compound, or the quaternary element compound may respectively be present in a uniform concentration in the quantum dot particle or having partially different concentrations in the same particle.

The metal oxide may comprise CdO, $In_2O_3$, PbO, HgO, MgO, $Ga_2O_3$, $Al_2O_3$, ZnO, $SiO_2$, ZnOS, ZnOSe, ZnOSeS, InPO, InPOS, or a combination thereof.

The metal-containing halogen compound may comprise LiF, NaF, KF, $BeF_2$, $MgF_2$, $CaF_2$, $SrF_2$, CuF, AgF, AuF, $ZnF_2$, $CdF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $CdCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, or a combination thereof.

In case of a nanocrystal particle including a semiconductor material (e.g., a quantum dot), the bandgap energy may be controlled with a size and a composition thereof and the luminous properties (e.g., color purity) are relatively excellent and high. Therefore, the quantum dot has drawn attention as a material suitable for various fields such as a display, an energy device, semiconductor, and biotechnology. In order to utilize the optical and/or electric properties of the quantum dots in various applications, a quantum dot having an inorganic shell has been suggested. For example, a quantum dot of a core-shell structure may include a core including Group III-V or Group II-VI compound semiconductor and a shell including Group II-VI compound semiconductor and having wider bandgap than the core. However, because the semiconductor nanocrystal of the core and the semiconductor nanocrystal of the shell have different lattice constants from each other, it is difficult to obtain a uniform shell coating. When a Group II-VI (for example, ZnSeS) shell is formed on a cadmium-free core, for example, a Group III-V (e.g. InP) semiconductor nanocrystal core, preparing a shell coating having fewer defects (e.g., an uniform shell coating) due to a lattice constant difference therebetween becomes more difficult.

In case of forming a coating of a shell having the different lattice constant, a thin shell may grow according to (e.g., in compliance with) the lattice constant of the core. However, increasing the shell thickness may result in a strain increase due to the difference of the lattice constant. Thus, the resulting shell tends to grow in compliance with its inherent lattice constant and thereby it becomes impossible to cover the entire surface of the core and thus the shell includes many defects on a surface thereof. Such phenomenon may become a reason of a decrease in the luminous efficiency of quantum dots. Therefore, in order to maximize the luminous efficiency by the shell coating, the shell have to have a small thickness of the shell, however, the thin shell is unfavorable in light of the thermal and optical stability of the quantum dot.

In an effort to address this problem, there was an attempt to provide a shell having an increased thickness using a layer-by-layer (LBL) method. But this technique was found to be effective only for a core/shell combination with a small difference in the lattice constant. In addition, there was an attempt to control the alloy composition in order to address such a problem. However, the foregoing attempt still has difficulties in forming a uniform coating because the shell tends to predominantly have the inherent lattice constant when it has a thickness over a predetermined value.

Most of the quantum dots capable of showing good light-emitting properties and stability include cadmium (Cd). For example, the quantum dots including Cd in the core and/or shell may exhibit relatively high luminous efficiency. However, because the cadmium is one of the elements causing a serious environmental problem, cadmium-free quantum dot may have a merit in terms of the environment. The Group III-V compound based semiconductor nanocrystal is a type of the cadmium free quantum dot. However, in case of the Group III-V compound based semiconductor nanocrystal, it is not easy to control a synthesis reaction because the precursor used for the synthesis thereof is more sensitive than those for the cadmium-based semiconductor nanocrystal (e.g., CdSe-based quantum dot). For the Group III-V compound based semiconductor nanocrystal, many researches were made on a quantum dot including a Group III-V core such as InP. However, synthesis of the InP-based semiconductor nanocrystal is not easy and the resulting quantum dot tends to have insufficient light emitting properties in comparison with the conventional Cd-based quantum dots.

A quantum dot according to an embodiment has a Group III-V (e.g., the indium phosphide based) core and the shell (or a multi-layered shell). The shell has a second semiconductor nanocrystal and a dopant wherein the second semiconductor nanocrystal has a different composition from the semiconductor nanocrystal of the core and includes zinc (Zn), selenium (Se), and sulfur (S), and the dopant includes lithium, a Group 2A metal having a smaller effective ionic radius than an effective ionic radius of $Zn^{2+}$, a Group 3A metal (or a semi-metal) having a smaller effective ionic radius than an effective ionic radius of an $Zn^{2+}$, or a combination thereof. In such a structure of the quantum dot, the shell may provide improved passivation even at the formation of the relatively thick shell and thus the resulting quantum dot may have improved properties.

The effective ionic radius of $Zn^{2+}$ is about 74 picometers (pm), the effective ionic radius of a lithium ion ($Li^+$) is about 76 pm, the effective ionic radius of a gallium ion ($Ga^{3+}$) is about 62 pm, and the effective ionic radius of an aluminum ion ($Al^{3+}$) is about 53.5 pm. The quantum dot with the foregoing structure may exhibit improved luminous properties and/or thermal stability (even when it does not include cadmium). The dopant may include aluminum (Al), lithium (Li), gallium (Ga), beryllium (Be), magnesium (Mg), boron (B), or a combination thereof.

As used herein, the term "ionic radius" refers to a radius of an ion; and the term "effective ionic radius" refers to a radius revised by Shannon, wherein the details thereof are described in R. D. Shannon (1976), "Revised effective ionic radii and systematic studies of interatomic distances in halides and chalcogenides," Acta Cryst A32: 751-767, Bibcode 1976 AcCrA.32.751S. doi:10.1107/50567739476001551, content of which is incorporated herein in its entirety by reference.

On the fabrication of a core-shell (or a core-multi-layered shell) type quantum dot, defects may occur, for example due to a lattice node or the like. For example, as the thickness of the shell increases, forming a uniform coating becomes progressively more difficult by the occurrence of such defects. In case of the disclosed quantum dot, however, the dopant (e.g., aluminum) may be introduced into the shell, for example, into the second semiconductor nanocrystal (e.g. including a ZnS based compound) of the shell. Without wishing to be bound by any theory, it is believed that this may contribute to the property improvement via the inhomogeneous stress induction and/or the defect passivation. (see FIG. 1, which shows the core 10, a shell 20 & 30, and a dopant 40)

For example, in case of the inhomogeneous stress induction, the additional metal (e.g., Al) having an appropriate effective ionic radius may be present at a time when metal doping or lattice ion substitution/injection occurs during the growth of the shell (e.g., at the initiation of the growing of the ZnS crystal lattice). Thus, the additional metal may enter into a preferential site among the ZnS crystal lattice, and thereafter, the crystal of the ZnS layer may grow in another direction (e.g., on another facet except for a {111} face) that is different from the direction of growing prior to the Al introduction (e.g., injection/substitution). By the introduction of the dopant, the inhomogeneous strain may be induced in the quantum dot, and thereby (e.g., in order to reduce the generated strain) the portion including the dopant as introduced may act as a seed capable of inducing a shell growth. Therefore, the ZnS crystal may grow at an increased rate and/or the ZnS may grow in another facet. In the defect passivation, the additional metal or dopant (e.g., Al) having an appropriate effective ionic radius may act as a tethering linker connecting the defect regions that can occur by the lattice shrinkage during the outermost layer (e.g. ZnS nanocrystal) lattice is grown, and this may result in the reduction of the number of defects in the outermost layer.

The content of dopant (e.g., in the quantum dot or in the shell) may be greater than or equal to about 0.0001 mole, for example, greater than or equal to about 0.0002 mole, greater than or equal to about 0.0003 mole, greater than or equal to about 0.0004 mole, greater than or equal to about 0.0005 mole, greater than or equal to about 0.0006 mole, greater than or equal to about 0.0007 mole, greater than or equal to about 0.0008 mole, greater than or equal to about 0.0009 mole, greater than or equal to about 0.001 mole, greater than or equal to about 0.0011 mole, greater than or equal to about 0.0012 mole, greater than or equal to about 0.0013, greater than or equal to about 0.0014 mole, greater than or equal to about 0.0015 mole, greater than or equal to about 0.0016 mole, greater than or equal to about 0.0017 mole, greater than or equal to about 0.0018 mole, greater than or equal to about 0.0019 mole, greater than or equal to about 0.002 mole, greater than or equal to about 0.0021 mole, greater than or equal to about 0.0022 mole, greater than or equal to about 0.0023 mole, greater than or equal to about 0.0024 mole, greater than or equal to about 0.0025 mole, greater than or equal to about 0.0026 mole, greater than or equal to about 0.0027 mole, greater than or equal to about 0.0028 mole, greater than or equal to about 0.0029 mole, greater than or equal to about 0.003 mole, greater than or equal to about 0.0035 mole, greater than or equal to about 0.004 mole, greater than or equal to about 0.0045 mole, greater than or equal to about 0.005 mole, greater than or equal to about 0.0055 mole, greater than or equal to about 0.006 mole, greater than or equal to about 0.0065 mole, greater than or equal to about 0.007 mole, greater than or equal to about 0.0075 mole, or greater than or equal to about 0.075 mole, based on one (1) mole of Zn.

The content of dopant (e.g., in the quantum dot or in the shell) may be less than or equal to about 0.3 mole, for example, less than or equal to about 0.25 mole, for example, less than or equal to about 0.2 mole, less than or equal to about 0.15 mole, or less than or equal to about 0.1 mole, based on one (1) mole of Zn.

In an embodiment, the content of dopant may be greater than or equal to about 0.01 mole, for example, greater than or equal to about 0.02 mole, greater than or equal to about 0.03 mole, greater than or equal to about 0.04 mole, greater than or equal to about 0.05 mole, greater than or equal to about 0.06 mole, greater than or equal to about 0.07 mole, greater than or equal to about 0.08 mole, greater than or equal to about 0.09 mole, greater than or equal to about 0.1 mole, greater than or equal to about 0.15 mole, greater than or equal to about 0.2 mole based on one (1) mole of the indium (e.g., included in the core).

In an embodiment, the content of dopant may be less than or equal to about 10 moles, for example, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles, based on one (1) mole of the metal included in the core.

The shell may not exhibit a crystalline peak, originating from the dopant, in the X-ray diffraction analysis. The quantum dot including the dopant in an amount of the foregoing ranges may exhibit improved light emitting properties. In the quantum dot or the shell, the content ratio of selenium with respect to sulfur may be less than about 1. The quantum dot or the shell may include the sulfur in an amount that is greater than the amount of selenium. In the quantum dot or the shell, the mole ratio of the sulfur with respect to the selenium may be greater than 1, for example, greater than or equal to about 1.1, greater than or equal to about 1.12, greater than or equal to about 1.13, greater than or equal to about 1.14, greater than or equal to about 1.15, greater than or equal to about 1.16, greater than or equal to about 1.17, greater than or equal to about 1.18, greater than or equal to about 1.19, greater than or equal to about 1.2, or greater than or equal to about 1.21. In the quantum dot or the shell, the mole ratio of the sulfur with respect to the selenium may be less than or equal to about 5, less than or equal to about 4, less than or equal to about 3, less than or equal to about 2, less than or equal to about 1.9, less than or equal to about 1.8, less than or equal to about 1.7, less than or equal to about 1.6, or less than or equal to about 1.5.

The shell including the second semiconductor nanocrystal may further include a halogen element such as fluorine, chlorine, bromine or the like. The halogen element may be derived from ionic liquid used for forming a shell. By having the foregoing structure, the quantum dot of the embodiment may exhibit an improved luminous efficiency (even though it does not include cadmium). For example, the quantum dot may have a full width at half maximum (FWHM) of less than or equal to about 45 nanometers (nm), less than or equal to about 42 nm, less than or equal to about 41 nm, less than or equal to about 40 nm, or less than or equal to about 39 nm. The quantum dot may have a quantum yield of greater than or equal to about 70%, for example, greater than or equal to about 71%, greater than or equal to about 72%, greater than or equal to about 73%, greater than or equal to about 74%, greater than or equal to about 75%, greater than or equal to about 76%, greater than or equal to about 77%, greater than or equal to about 78%, greater than or equal to about 79%, or greater than or equal to about 80%.

The quantum dot may absorb light having a wavelength range of about 300 nm to about 700 nm, and emit light having a wavelength range of about 400 nm to about 600 nm, about 600 nm to about 700 nm, or about 550 nm to about 650 nm, but is not limited thereto. The light emitting wavelength may be readily controlled by adjusting a (core/shell) composition, a size, or the like of the quantum dot. The quantum dot may have a peak emission wavelength that is substantially the same as or is red-shifted from that of the un-doped quantum dot with the same compositions of the core/shell.

The quantum dot may have a particle size (e.g., a diameter in case of a spherical particle or a longest length of a straight line crossing the particle in case of the non-spherical particle) of about 1 nm to about 100 nm, for example, about 1 nm to about 20 nm, or about 1 nm to about 10 nm. The quantum dot may include a shell having a reduced number of defects even when the shell has an increased thickness. The size of the quantum dot may be greater than or equal to about 3 nm, greater than or equal to about 4 nm, greater than or equal to about 5 nm, or greater than or equal to about 6 nm. The size of the quantum dot may be less than or equal to about 50 nm, less than or equal to about 40 nm, less than or equal to about 30 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm. The shape of quantum dot is not particularly limited. For example, the quantum dot may have a spherical shape, an ellipsoidal shape, a pyramid shape, a multi-armed (or multipod) or cubic shape, but is not limited thereto.

The presence of the dopant included in the quantum dot may be confirmed by an X-ray photoelectron spectroscopy (XPS), an Inductively Coupled Plasma Atomic Emission Spectroscopy (ICP-AES), a Time of Flight Secondary Ion Mass Spectrometry (TOF-SIMS) and the like, but is not limited thereto. For example, the amount of the dopant included in the quantum dot may be confirmed by an XPS analysis, an ICP-AES analysis, or the like.

The quantum dot may include an organic ligand on the surface of the quantum dot. The organic ligand may be bound to the surface of the quantum dot. The organic ligand may include a compound of the formula RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO $(OH)_2$, $R_2POOH$ (wherein, R and R' are each independently a C1 to C24 substituted or unsubstituted aliphatic hydrocarbon group (e.g., a C1 to C24 substituted or unsubstituted alkyl group, a C2 to C24 substituted or unsubstituted alkenyl group, a C2 to C24 substituted or unsubstituted alkynyl group), or a C6 to C20 substituted or unsubstituted aromatic hydrocarbon group (e.g., a C6 to C20 substituted or unsubstituted aryl group)), or a combination thereof. The organic ligand may coordinate to the surface of the obtained nanocrystal, allowing the nanocrystal to be well dispersed in the solution and/or having an effect on the light emitting and electrical properties of the quantum dot. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)) and the like phosphine; a substituted or unsubstituted methyl phosphine oxide (e.g., trimethyl phosphine oxide, or methyldiphenyl phosphineoxide), a substituted or unsubstituted ethyl phosphine oxide (e.g., triethyl phosphine oxide, or ethyldiphenyl phosphineoxide), a substituted or unsubstituted propyl phosphine oxide, a substituted or unsubstituted butyl phosphine oxide, a substituted or unsubstituted octylphosphine oxide (e.g., trioctylphosphineoxide (TOPO) and the like phosphine oxide; diphenyl phosphine, tri phenyl phosphine compound, or an oxide compound thereof; phosphonic acid, and the like, but are not limited thereto. The organic ligand may be used alone or in a combination of at least two compounds.

In another embodiment, a method of producing the quantum dot includes providing, e.g., preparing, a mixture including a particle including a core including a first semiconductor nanocrystal (hereinafter, referred to also as a core particle), a first shell precursor containing zinc (Zn), a second shell precursor containing sulfur (S), a third shell precursor containing selenium (Se), an organic ligand, a solvent, and a dopant precursor including a dopant; and heating the mixture to a reaction temperature to form a shell including a second semiconductor nanocrystal and a dopant on the particle.

The dopant includes lithium, a Group 2A metal having an effective ionic radius less than an effective ionic radius of $Zn^{2+}$, a Group 3A element having an effective ionic radius less than an effective ionic radius of $Zn^{2+}$, or a combination thereof.

The providing of the mixture may include forming a shell layer (e.g., first layer) directly on the core that includes a third semiconductor nanocrystal having a different composition from the second semiconductor nanocrystal and does not include the dopant. The providing of the mixture may include preparing a plurality of mixtures having different compositions (for example, including different core particles, or having a different ratio of at least one of the first shell precursor, the second shell precursor, and the third shell precursor).

The method may further include preparing the mixture including a greatly reduced amount of the third shell precursor. The method may further include preparing a mixture including the core particle, the first shell precursor, the second shell precursor, an organic ligand, a solvent, and optionally a dopant precursor and reacting the mixture to form a ZnS shell optionally doped with the dopant over the core particle for example as an outermost layer.

Details of the first semiconductor nanocrystal, the second semiconductor nanocrystal, the third semiconductor nanocrystal, the dopant, and the organic ligand are the same as described above.

The core particle including the first semiconductor nanocrystal, the third semiconductor nanocrystal, and the second semiconductor nanocrystal may be prepared by any suitable method and is not particularly limited. For example, the first, the third, or the second semiconductor nanocrystal may be prepared by reacting a metal precursor including a Group II metal, a Group III metal, a Group IV metal, or a combination thereof and a non-metal precursor including a Group V element (or a compound including the same) or a Group VI element (or a compound including the same).

Examples of the metal precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, mercury acetate, mercury iodide, mercury bromide, mercury chloride, mercury fluoride, mercury cyanide, mercury nitrate mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, trimethyl gallium, triethyl gallium, gallium acetylacetonate, gallium chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, and thallium carbonate, but are not limited thereto. The metal precursor may be used alone or in a combination of two or more depending on a desired composition of the semiconductor nanocrystal sought to be prepared.

Examples of the non-metal precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris trimethylsilyl phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, and the like, but are not limited thereto. The non-metal precursor may be used alone or in a combination of two or more depending on a desired composition of the semiconductor nanocrystal sought to be prepared.

The types and the amount of the first shell precursor are not particularly limited, and may be appropriately selected in light of the composition of the second semiconductor nanocrystal. For example, the first shell precursor may be a Zn metal powder, an alkylated Zn compound, Zn alkoxide, Zn carboxylate, Zn nitrate, Zn perchlorate, Zn sulfate, Zn acetylacetonate, Zn halide, Zn cyanide, Zn hydroxide, Zn oxide, or Zn peroxide. Examples of the first shell precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The first shell precursor may be used alone or in a combination of two or more compounds depending on the composition of the second semiconductor nanocrystal.

The types and the amount of the second shell precursor may be selected appropriately and are not limited particularly. Examples of the second shell precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-(S-TOA), trimethylsilyl sulfur, ammonium sulfide, and sodium sulfide, but are not limited thereto.

The types and the amount of the third shell precursor may be selected appropriately and are not limited particularly. Examples of the third shell precursor may include selenium-trioctylphosphine Se-TOP), selenium-tributylphosphine (Se-TBP), and selenium-triphenylphosphine (Se-TPP), but are not limited thereto.

The second shell precursor and the third shell precursor may be used alone or in a combination of two or more compounds depending on the composition of the second semiconductor nanocrystal.

The dopant precursor may include an oleate, a stearate, a chloride, an octanoate, a hydride, an isopropoxide, a palmitate, an organoborane, or a combination thereof. The dopant may include aluminum (Al), lithium (Li), gallium (Ga), beryllium (Be), magnesium (Mg), boron (B), or a combination thereof.

The dopant precursor may include aluminum oleate, aluminum mono stearate, aluminum chloride, aluminum octanoate, aluminum isopropoxide, lithium palmitate, lithium octanoate, magnesium stearate, magnesium oleate, magnesium (isopropyl) chloride, borane, triethylborane, gallium oleate, or a combination thereof.

The outermost layer composition of the shell of the obtained quantum dots may be controlled by adjusting the adding time and the adding amount of precursors and the temperature of the reaction mixture.

The first shell precursor, the second shell precursor, the third shell precursor, and the dopant precursor may each independently be at least two types of compounds. When using at least two types of precursors, each precursor may be added into the (optionally heated) reaction mixture (at the same or different temperature), simultaneously or with a predetermined time lag. For example, each precursor may be mixed with the same/different kind of ligand and/or solvent (e.g., organic solvent), considering the shell composition of the final quantum dot, and then added into the reaction system for one or more times.

The solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; C6 to C40 aliphatic hydrocarbon (e.g., alkane, alkene, or alkyne) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine, a phosphine oxide substituted with a C6 to C22 alkyl group such as trioctylphosphine oxide; a C12 to C22 aromatic ether such as phenyl ether, or benzyl ether, or a combination thereof. The types and the amount of the solvent may be appropriately selected considering the types of the precursors and the organic ligands. A combination comprising at least two of the foregoing may be used.

In the mixture, the amount of each of the components (e.g., the first shell precursor, the second shell precursor, the third shell precursor, and the like) may be appropriately controlled depending on a desired property (e.g., considering a desired thickness of the shell, a desired composition of the shell, the types of the precursor, and the like), and is not particularly limited. The amount of the dopant precursor may be controlled considering the types of the dopant, the doped amount thereof, and the like, and is not particularly limited. The amount of the dopant precursor may be greater than or equal to about 0.001 mole and less than or equal to about 0.5 mole, per one mole of the first shell precursor, but it is not limited thereto.

The mixture is heated at a reaction temperature to perform a reaction between the first shell precursor and at least one of the second shell precursor and the third shell precursor. A shell layer including the second semiconductor nanocrystal including Zn, Se, and S is formed on the core particle, and simultaneously, a dopant may be introduced into the second semiconductor crystal (e.g., is doped into second semiconductor nanocrystal).

The reaction temperature is not particularly limited, but may be appropriately selected considering the type of the first shell precursor, the second shell precursor, the third precursor, the dopant precursor, and the solvent and/or organic ligand. For example, the reaction temperature may be greater than or equal to about 100° C., for example, greater than or equal to about 120° C., greater than or equal to about 150° C., greater than or equal to about 170° C., greater than or equal to about 200° C., greater than or equal to about 210° C., greater than or equal to about 220° C., greater than or equal to about 230° C., greater than or equal to about 240° C., greater than or equal to about 250° C., or greater than or equal to about 260° C. For example, the reaction temperature may be less than or equal to about 350° C., for example, less than or equal to about 340° C., or less than or equal to about 330° C. For example, the reaction temperature may range from about 220° C. to about 340° C.

The reaction time is not particularly limited, and may be appropriately selected. For example, the reaction may be performed for greater than or equal to about 1 second, for example, greater than or equal to about 1 minute, greater than or equal to about 5 minutes, greater than or equal to about 10 minutes, greater than or equal to about 15 minutes, greater than or equal to about 20 minutes, or greater than or equal to about 25 minutes, but is not limited thereto. When the precursor mixture is added in a stepwise, the reaction may be performed at each step for a predetermined time (e.g., greater than or equal to about 5 minutes, greater than or equal to about 10 minutes, or greater than or equal to 15 minutes). The reaction may be performed under the inert gas atmosphere or under air or vacuum, but is not limited thereto.

The second shell precursor, the third shell precursor, and the dopant precursor may be further added for at least a selected number of additions (e.g., for one time, for 2 times, for 3 times, for 4 times, or for the more).

The method may further include adding ionic liquid into the (optionally heated) mixture. The ionic liquid may be added with the second shell precursor and the precursor for the additional metal. The ionic liquid is a liquid state salt and includes an ion and a counter ion. In an embodiment, the ionic liquid may include a substituted or unsubstituted imidazolium salt, a substituted or unsubstituted pyrazolium salt, a substituted or unsubstituted triazolium salt, a substituted or unsubstituted thiazolium salt, a substituted or unsubstituted oxazolium salt, a substituted or unsubstituted pyridazinium salt, a substituted or unsubstituted pyrimidinium salt, a substituted or unsubstituted ammonium salt, a substituted or unsubstituted phosphonium salt, a substituted or unsubstituted sulfonium salt, a substituted or unsubstituted pyridinium salt, a substituted or unsubstituted pyrrolidinium salt. The ionic liquid may include an anion selected from a halide anion such as $F^-$, a tetrafluoroborate anion ($BF_4^-$), a hexafluorophosphate anion ($PF_6^-$), $ClO_4^-$, an acetate anion, a trifluoroacetate anion, a triflate anion, a hydrogen sulfate anion, an alkylsulfate anion, a sulfite anion, a hydrogen sulfite anion, a chloroaluminate anion, a tetrabromoaluminate anion, a nitrite anion, a nitrate anion, a dichloro cuprate anion, a phosphate anion, a hydrogen phosphate anion, a dihydrogen phosphate anion, a carbonate anion, a hydrogen carbonate anion, a sulfonate anion, a tosylate anion, or a bis(trifluoromethylsulfonyl)imide anion. In an embodiment, the ionic liquid may be an imidazolium salt, a pyridinium salt, a phosphonium salt, or an ammonium salt, and the anion may include $F^-$, $BF_4^-$, or $PF_6^-$.

The ionic liquid may include 1-butyl-3-methylimidazolium tetrafluoroborate, 1-hexyl-3-methylimidazolium tetrafluoroborate, 1-hexyl-3-methylimidazolium hexafluorophosphate, or a combination thereof. The ionic liquid may be used alone or in a combination of two or more salts.

The amount of the ionic liquid may be less than or equal to about 20 volume percent (volume %), for example, about 1 volume % to about 10 volume %, or about 1 volume % to about 20 volume %, based on the total volume of the organic solvent in the reaction mixture. When the ionic liquid is added, the quantum dot-polymer composite film including the obtained quantum dots may exhibit the improved luminance.

When the non-solvent is added into the obtained final reaction solution, the organic ligand-coordinated nanocrystal may be separated (e.g. precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if desired. The washing solvent is not particularly limited and may include a solvent having a similar solubility parameter to that of the ligand and may, for example, include hexane, heptane, octane, chloroform, toluene, benzene, and the like.

In another embodiment, a quantum dot polymer composite may include a polymer matrix; and the quantum dot disposed, e.g., dispersed, in the polymer matrix.

The polymer matrix may be a thiol-ene polymer, a (meth) acrylate-based polymer, a urethane-based polymer, an epoxy-based polymer, a vinyl-based polymer, a silicone polymer, or a combination thereof. The thiol-ene polymer is disclosed in US-2012-0001217-A1 which is incorporated herein by reference. The (meth)acrylate-based polymer, the urethane based polymer, the epoxy-based polymer, the vinyl-based polymer, and the silicone polymer may be synthesized by known methods, or monomers or polymers thereof may be commercially available.

An amount of the quantum dot in the polymer matrix may be appropriately selected and is not particularly limited. For example, the amount of the quantum dot in the polymer matrix may be greater than or equal to about 0.1 weight percent (wt %) and less than or equal to about 50 wt %, based on the total weight of the quantum dot-polymer composite, but is not limited thereto.

A method of manufacturing the quantum dot polymer composite may include mixing a dispersion including the quantum dot with a solution including a polymer and then, removing a solvent therefrom but is not limited thereto. Alternatively, the quantum dot polymer composite may be obtained by dispersing the quantum dot in a monomer mixture for forming the polymer and polymerizing the obtained final mixture. The quantum dot-polymer composite may have a sheet shape, a chip shape, or a rod (e.g., rail) shape.

Figure 2:
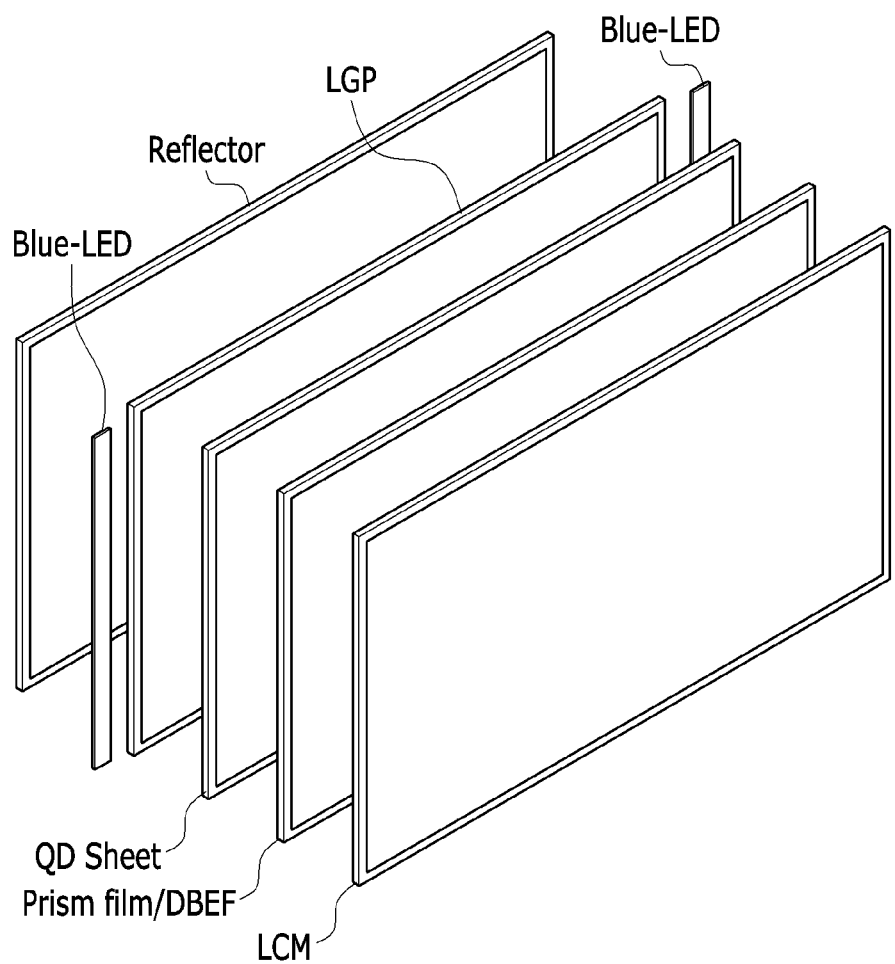
FIG. 2 is a schematic view showing an embodiment of an electronic device (e.g., a liquid crystal display)

Another embodiment provides an electronic device including the quantum dot. Details of the quantum dot are the same as described above. The device may be a light emitting diode (LED), an organic light emitting diode (OLED), various displays (e.g., liquid crystal display (LCD)), a sensor, a solar cell, a hybrid composite, bio labeling, or an imaging sensor, security-ink, various lightings, and the like, but is not limited thereto. FIG. 2 shows a simplified stacking structure of a liquid crystal display (LCD) including the quantum dot sheet among these devices. The general structure of the liquid crystal display (LCD) is well known, and FIG. 2 shows a simplified structure.

Referring to FIG. 2, the liquid crystal display may have a structure that a reflector, a light guide panel (LGP) and a blue LED light source (Blue-LED), a quantum dot-polymer composite sheet (QD sheet), various optical films (e.g., a prism film, and a double brightness enhance film (DBEF) are stacked, and a liquid crystal panel module (LCM) is disposed thereon.

Hereinafter, the embodiments are illustrated in more detail with reference to examples. However, they are exemplary embodiments of the present invention, and the present invention is not limited thereto.

EXAMPLES

Analysis Method

[1] Photoluminescence Analysis of Quantum Dots

F7000 fluorescence spectrophotometer of Hitachi Co., Ltd. is used to measure a quantum yield of a quantum dot solution at an excitation wavelength of 365 nm or 458 nm.

[2] XPS Analysis

Quantum 2000 made by Physical Electronics, Inc. is used to perform an XPS element analysis under the conditions of an acceleration voltage: 0.5-15 keV, 300 W, and a minimum analysis area: 200×200 pmt.

[3] Inductively Coupled Plasma Atomic Emission Spectrophotometer (ICP-AES)

It is performed using Shimadzu ICPS-8100.

[4] Time-of-Flight Secondary Ion Mass Spectrometry (TOF-SIMS)

TOF-SIMS V (ION-TOF GmbH, Germany) mounted with a 25 keV $Bi^+$ ion gun is used to perform a (TOF-SIMS) analysis. For TOF-SIMS, the ion gun operates in a sample holder at an average current of 0.2 pA ($Bi^+$) and 5 kHz. Using a bunch pulse of 0.7 ns duration, a mass resolution (M/DM) is set to be greater than 8000. 200×200 $mm^2$ area is rasterized to provide a SIMS spectrum, wherein the ion dose is maintained at $10^{12}$ ions $cm^{-2}$ during the period. The anion mass spectrum is internally calibrated using C—, CH—, $C_2H$— and $C_4H$-peaks.

[5] Conversion Efficiency (CE)

The conversion efficiency is a ratio of the emission amount of quantum dot polymer composite with respect to the light amount in which the quantum dot polymer composite absorbs from the exciting light. The total light amount (B) of exciting light (i.e., blue light) is obtained by integrating PL spectrum of the exciting light, and the PL spectrum of the quantum dot polymer composite film is measured, so the light amount (A) of green or red wavelength light and the light amount (B') of blue light emitted from the quantum dot polymer composite film are obtained to provide a conversion efficiency by the following formula:

conversion efficiency (%)=$A/(B-B')\times 100\%$

The obtained conversion efficiency is a front conversion efficiency. The quantum dot polymer composite film is prepared in the following manner:

Quantum dots are separated from a quantum dot dispersion by non-solvent precipitation and centrifugation. The separated quantum dots are mixed with a monomer combination to obtain a mixture, the mixture thus obtained is applied to a predetermined substrate and a barrier film is covered thereon, the resulting product is cured. The monomer combination is prepared by mixing pentaeritrytol tetrakis(3-mercapto propionate), 1,3,5-triallyl-1,3,5-trizaine-2,4,6-trione: TTT), and irgacure 754 at a weight (e.g., gram) ratio of 0.89:0.61:0.03. In the Examples and the Comparative Examples, the amount of the quantum dots is set to be a predetermined value for the preparation of the quantum dot film for measuring the photoconversion efficiency.

The prepared quantum dot polymer composite film is inserted between a waveguide plate and an optical sheet in a 60 inch TV set equipped with a blue LED having a peak wavelength of 458 nm.

[6] Thermal Stability Evaluation

A cyclohexane dispersion of the quantum dots is coated on a glass substrate to form a quantum dot thin film and heat-treated at 180° C. for 10 minutes, and then a ratio of luminance intensity after the heat treatment with respect to the luminance intensity before the heat treatment is measured.

[7] XRD Analysis

An X ray diffraction analysis is conducted by using Philips XPert PRO X ray diffractometer to obtain an XRD spectrum.

Reference Example 1: Preparation of InZnP Core 0.2 mmol of indium acetate, 0.125 mmol of zinc acetate, 0.6 mmol of palmitic acid, 10 mL of 1-octadecene are placed into a reactor and heated at 120° C. under the vacuum. After one hour, atmosphere in the reactor is changed to nitrogen. It is heated at a high temperature of about 250° C. and rapidly injected with a mixed solution of 0.15 mmol of tris(trimethylsilyl) phosphine (TMS3P) and 1 mL of trioctylphosphine and reacted for 20 minutes. Acetone is added into the reaction solution which is rapidly cooled to room temperature and centrifuged to provide a precipitation, and the precipitation is dispersed into toluene or cyclohexane. From the UV spectrophotometry results of InZnP semiconductor nanocrystal, it is confirmed that the UV first absorption maximum wavelength is 440 nm, and from this result, it is confirmed that the core diameter is about 2 nm.

Example 1-1

[1] In a 300 mL flask, 0.6 mmoL of zinc acetate and 1.2 mmol of oleic acid are dissolved in trioctylamine and vacuum-treated at 120° C. for 10 minutes. An atmosphere in the flask is substituted with nitrogen ($N_2$) and the mixture is heated at 280° C. to obtain a stock solution.

To the stock solution, the InZnP core prepared in Reference Example 1 and Se/TOP and S/TOP are added and heated to a reaction temperature for a predetermined time in four steps or in five steps. In each step, the molar ratio between the selenium and the sulfur and the duration of the reaction are controlled to obtain a quantum dot having a core and a multi-layered shell.

In each step, the mole ratio between the Se/TOP and S/TOP is selected for a molar ratio of S:Se to be from about 0:6 to about 6:0 (S:Se=0:6 to 6:0). In the first step, only the Se/TOP is injected. In the final step, only the S/TOP is injected. Thus, the resulting quantum dot has the InZnP core, the ZnSe layer directly disposed on the core, and the ZnS layer as the outermost layer. In the intermediate steps, both of the Se/TOP and S/TOP are used to form a shell layer of ZnSeS (e.g., the second semiconductor nanocrystal, for example, to have the structure as shown in FIG. 3). In FIG. 3, "ZnSe rich" refers to the case where ZnSe is rich and "ZnS rich" refers to the case where ZnS is rich. During the intermediate steps, aluminum is doped by using aluminum oleate as an aluminum precursor (the used amount of the dopant precursor: 0.1 mmol).

The total amount of the selenium as used is 0.3 mole and the total amount of the sulfur as used is 0.9 mole. In each reaction step, the reaction temperature is adjusted between 280° C. and 360° C. and the duration of each reaction step is adjusted between about 5 min and one hour to obtain a predetermined thickness for each layer of the shell.

After the final reaction step, the obtained reaction product is cooled to room temperature (e.g., 20° C.). Ethanol is added to the cooled reaction mixture to form a precipitate. The formed precipitate is separated and the quantum dot thus obtained are dispersed in toluene.

Figure 4:
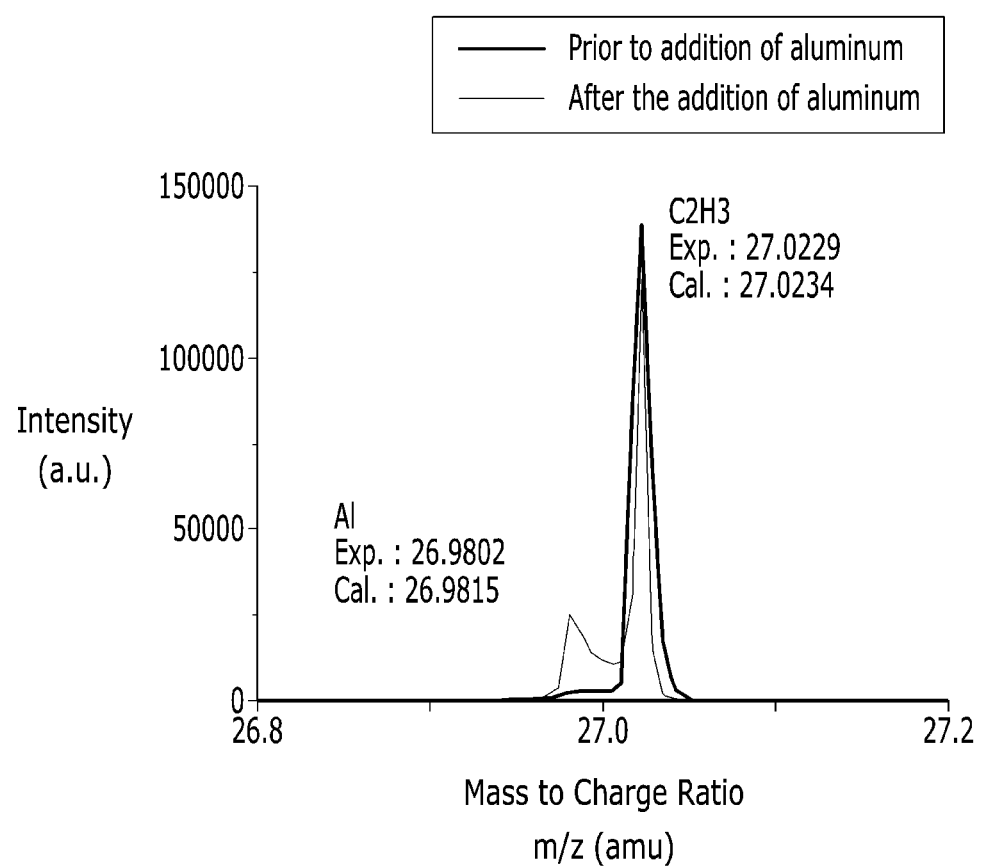
FIG. 4 is a graph of intensity (arbitrary units, a.u.) versus mass to charge ratio (atomic mass units, amu) which shows the results of a time of flight secondary ion mass spectrometry (TOF-SIMS) analysis for the quantum dots during the synthesis of Example 1-1.

[2] A TOF-SIMS analysis is made for two samples, one being taken from a reaction mixture prior to injection of aluminum oleate in the reaction system and the other being taken from a reaction mixture after injection of aluminum oleate in the reaction system. The results are shown in FIG. 4. From the results of FIG. 4, it is confirmed that the sample taken from the reaction mixture prior to using the aluminum precursor does not include aluminum while the sample taken from the reaction mixture after using the aluminum precursor includes aluminum.

For the prepared quantum dots, a photoluminescent analysis is conducted by using excitation light of 365 nm or 458 nm. The results confirm that the FWHM is about 38 nm, the peak emission wavelength is 530 nm to 540 nm, and the quantum efficiency is about 80% or higher (e.g., 90% or 98%).

Using the prepared quantum dots, a quantum dot-polymer composite film is prepared and a photoconversion efficiency is measured for the film. The results confirm that the photoconversion efficiency of the quantum dot polymer composite film is about 62% or higher (e.g., 62% to 62.6% depending on the step of the aluminum injection).

Example 1-2

Quantum dots are prepared in the same manner as in Example 1-1, except for using aluminum chloride instead of aluminum oleate as a precursor.

For the prepared quantum dots, a photoluminescent analysis is conducted by using excitation light of 365 nm or 458 nm. The results confirm that the FWHM is about 38 nm, the peak emission wavelength is 538 nm to 540 nm, and the quantum efficiency is about 80%.

Using the prepared quantum dots, a quantum dot-polymer composite film is prepared and a photoconversion efficiency is measured for the film. The results confirm that the photoconversion efficiency of the quantum dot polymer composite film is about 62% or higher.

Comparative Example 1

Quantum dots are prepared in the same manner as in Example 1-1, except for not using any aluminum precursor.

For the prepared quantum dots, a photoluminescent analysis is conducted by using excitation light of 365 nm or 458 nm. The results confirm that the FWHM is about 38 nm, the peak emission wavelength is 538 nm to 540 nm, and the quantum efficiency is about 71%.

Using the prepared quantum dots, a quantum dot-polymer composite film is prepared and a photoconversion efficiency is measured for the film. The results confirm that the photoconversion efficiency of the quantum dot polymer composite film is about 57% or higher.

From the foregoing results, the quantum dots of the Examples having a shell including the aluminum dopant and ZnSeS show higher quantum efficiency than those of the Comparative Example. The quantum dots of the Examples show an increase in the front photoconversion efficiency of the film by at least 3% in comparison with the undoped quantum dots. Such results indicate that there is a relatively great increase in the luminous efficiency considering the fact that the quantum dot emit light in all directions.

Experimental Example 1

[1] For the quantum dots prepared in Example 1-1, an XPS analysis is carried out and the results are shown in Table 1.

TABLE 1

| Peak | Al2p | P2p | S2p.cf2 | Zn2p3 | Se3d | In3d5 |
|---|---|---|---|---|---|---|
| intensity | 0.73 | 1.99 | 14.18 | 18.41 | 4.04 | 0.57 |

The results of Table 1 confirm that the mole ratio of the aluminum with respect to Zn confirmed by the XPS analysis is 0.039 (=0.73/18.41).

Figure 6:
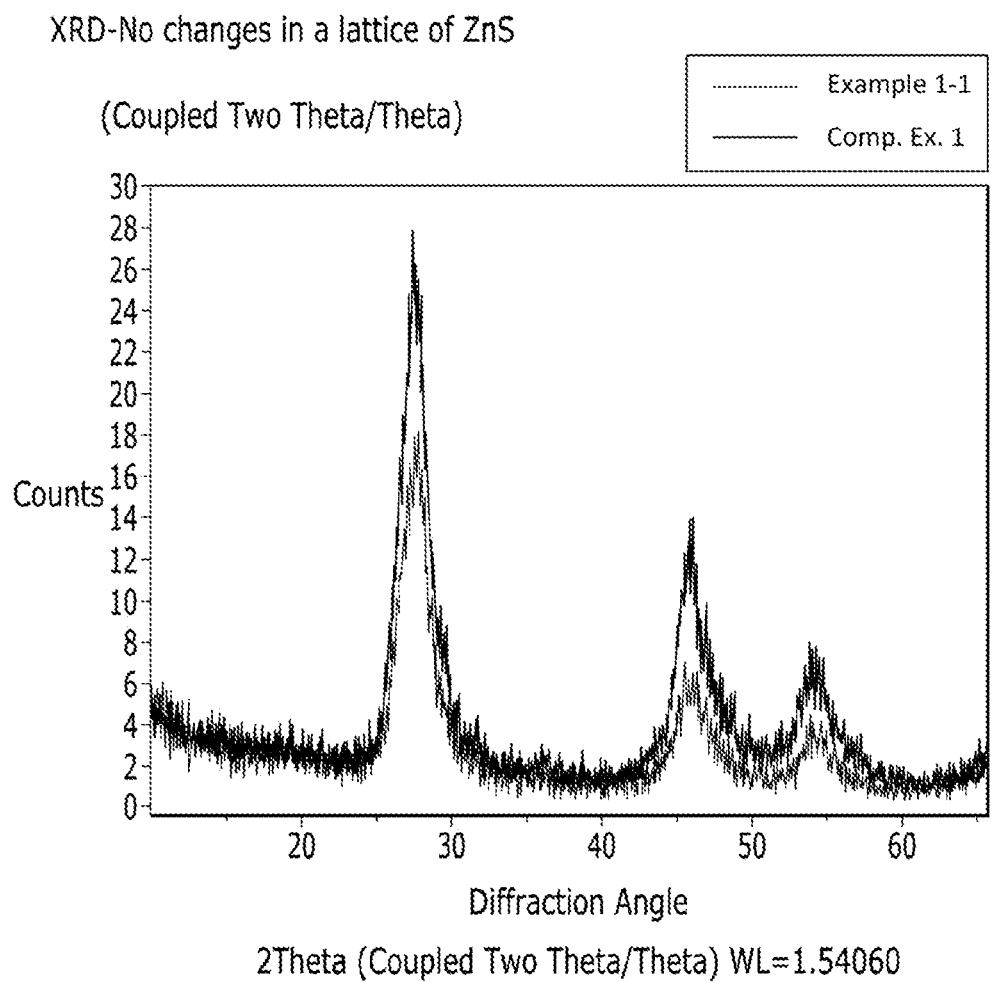
FIG. 6 is a graph of counts versus diffraction angle (two-theta) showing the results of X-ray diffraction analysis for the quantum dots of Comparative Example 1 and the quantum dots of Example 1-1.

[2] An XRD analysis is conducted for the (aluminum doped) quantum dot of Example 1-1 and the non-doped quantum dot of Comparative Example 1. The results are shown in FIG. 6. The quantum dot prepared in Example 1-1 have the peaks at substantially the same positions as those of the non-doped quantum dot of Comparative Example 1.

Experimental Example 2

For the quantum dots prepared in Example 1-1, an ICP-AES analysis is carried out. The results confirm that the mole ratio of the aluminum with respect to the zinc (Al/Zn) is about 0.008 to 0.05 while the mole ratio of the aluminum with respect to the indium (Al/In) is about 0.24 to 1.56.

Example 2

Quantum dots are prepared in the same manner as in Example 1-1, except for using gallium oleate instead of the aluminum oleate.

Figure 5:
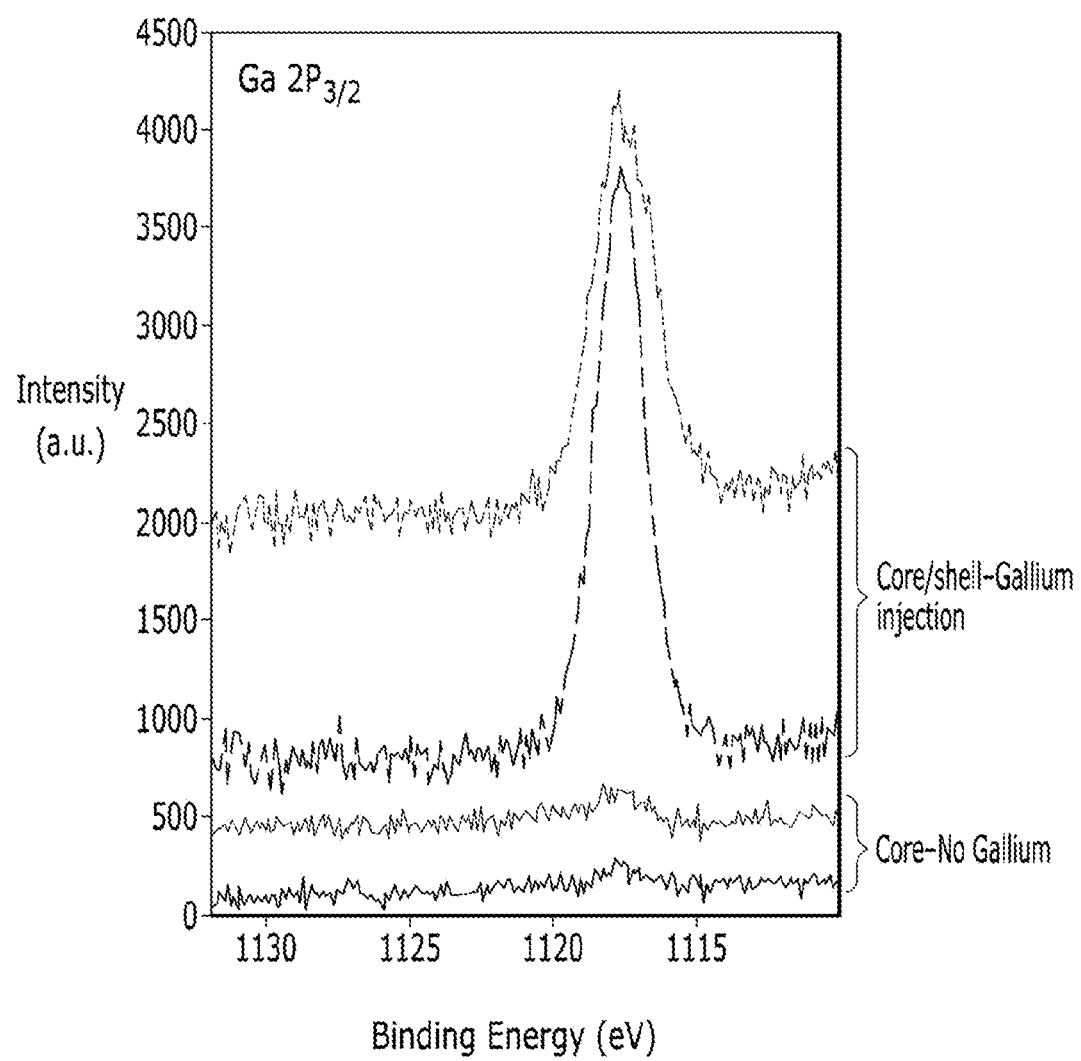
FIG. 5 is a graph of intensity (arbitrary units, a.u.) versus binding energy (electron volts, eV), which shows results of X-ray photoelectron spectroscopy (XPS) analysis for the gallium-doped quantum dots synthesized in Example 2.

FIG. 5 shows the XPS results of the obtained quantum dots. From the results shown in FIG. 5, it is confirmed that the obtained quantum dot includes gallium.

The quantum dot-polymer composite film including the obtained quantum dots is measured for a conversion efficiency, and it is confirmed to be about 60%.

Example 3-1 to 3-9

[1] Quantum dots are prepared in the same manner as in Example 1-1, except for using different amounts of aluminum oleate set forth in Table 2.

For the prepared quantum dots, a photoluminescent analysis is conducted by using excitation light of 365 nm or 458 nm. The results are compiled in Table 2.

Using the prepared quantum dots, a quantum dot-polymer composite film is prepared and a photoconversion efficiency (PCE) is measured for the film. The results are compiled in Table 2, as well.

TABLE 2

| | Amount of aluminum oleate (mmol) | QY (%) and FWHM (nm) | PCE of the quantum dot-polymer composite film (%) |
|---|---|---|---|
| Example 3-1 | 0.01 | 90%, 38 nm | 60.8 |
| Example 3-2 | 0.02 | 90%, 38 nm | 61.1 |
| Example 3-3 | 0.04 | 89%, 38 nm | 62.5 |
| Example 3-4 | 0.1 | 86.5%, 38 nm | ~62% |
| Example 3-5 | 0.2 | 83%, 38 nm | 59.7 |

The results of Table 2 confirm that the quantum dot has increased photoluminescent properties by the aluminum doping.

[2] Quantum dots are prepared in the same manner as in Example 1-1, except for using different amounts of aluminum monostearate set forth in Table 3.

For the prepared quantum dots, a photoluminescent analysis is conducted by using excitation light of 365 nm or 458 nm. The results are compiled in Table 3.

Using the prepared quantum dots, a quantum dot-polymer composite film is prepared and a photoconversion efficiency (PCE) is measured for the film. The results are compiled in Table 3, as well.

TABLE 3

| | The used amount of the aluminum monostearate (mmol) | QY (%) and FWHM (nm) | PCE of the quantum dot-polymer composite film (%) |
|---|---|---|---|
| Example 3-6 | 0.04 | 89%, 38 nm | 61.2 |
| Example 3-7 | 0.1 | 98%, 38 nm | 61.4 |
| Example 3-8 | 0.2 | 96%, 38 nm | 59.6 |
| Example 3-9 | 0.4 | 85%, 38 nm | 59.6 |

The results of Table 3 confirm that the quantum dot has increased photoluminescent properties by the aluminum doping.

Example 4

Quantum dots are prepared in the same manner as in Example 1-1, except for using lithium palmitate, as it is or as it is dissolved in a carrier solvent such as trioctylamine, is injected in the third step or the fifth step, instead of the aluminum precursor. It is confirmed that the obtained quantum dots have a photoconversion efficiency of 61.8% and 61.6%, respectively. The results of the ICP-AES confirm that in the quantum dot, the molar amount of lithium with respect to the zinc is 0.2.

Example 5

Quantum dots are prepared in accordance with the same procedure as in Example 1-1, except that trioctylamine solution including a predetermined amount of magnesium isopropyl chloride is added in the fourth step, instead of aluminum precursor. It is confirmed that the obtained quantum dot has a conversion efficiency of each 60.3%.

Example 6

Quantum dots are prepared in accordance with the same procedure as in Example 1-1, except that a trioctylamine solution including a predetermined amount of triethylborane is added in the fourth step, instead of the aluminum precursor. It is confirmed that the obtained quantum dot has a conversion efficiency of each 60.8%.

Comparative Examples 2-1 and 2-2

Aluminum doped InZnP/ZnSe:Al quantum dots are prepared in a manner similar to that of Example 1-1, except for not using the sulfur precursor (Comp. Example 2-1).

Non-doped InZnP/ZnSe quantum dots are prepared in the same manner as Comparative Example 2-1, except for not using the aluminium precursor (Comp. Example 2-2).

For the prepared quantum dots, a photoluminescent analysis is conducted by using excitation light of 365 nm or 458 nm. The results are compiled in Table 4.

Comparative Examples 3-1 and 3-2

Aluminum doped InZnP/ZnS:Al quantum dots are prepared in a manner similar to that of Example 1-1, except for not using the selenium precursor (Comp. Example 3-1).

Non-doped InZnP/ZnS quantum dots are prepared in the same manner as Comparative Example 3-1, except for not using the aluminium precursor (Comp. Example 3-2).

For the prepared quantum dots, a photoluminescent analysis is conducted by using excitation light of 365 nm or 458 nm. The results are compiled in Table 4.

TABLE 4

| | QD solution | | |
|---|---|---|---|
| | Photoluminescent (PL) | | |
| | Peak wavelength (nm) | FWHM (nm) | Quantum yield (QY) |
| Comp. Example 2-2 (InZnP/ZnSe) | 540 | 40 | 37% |
| Comp. Example 2-1 InZnP/ZnSe:Al | 539 | 39 | 36% |
| Comp. Example 3-2 (InZnP/ZnS) | 489 | 43 | 28% |
| Comp. Example 3-1 (InZnP/ZnS:Al) | 490 | 43 | 28% |

The results of Table 4 confirm that doping a ZnS shell or a ZnSe shell on the InP based core with the aluminum has no effect of improving the luminous properties.

Experimental Example 3: Thermal Stability Evaluation

A thermal stability test is performed for quantum dots obtained from Example 1-1, quantum dots (Ref.) obtained from Comparative Example 1, and quantum dots obtained from Example 4. The results are shown in the following Table:

TABLE 5

| Quantum dot | Maintenance rate |
|---|---|
| Comparative Example 1 | 39% |
| Example 1-1 | 48% |
| Example 4 | 44% |

From the results, it is confirmed that quantum dots according to the Examples may show improved thermal stability in comparison with the quantum dots of the Comparative Example.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a light source emitting a blue light; and
a quantum dot polymer composite comprising a quantum dot,
wherein a portion of the blue light is configured to be absorbed by the quantum dot,
wherein the quantum dot comprises:
a core comprising a first semiconductor nanocrystal, and
a shell disposed on the core, the shell comprising a second semiconductor nanocrystal and a dopant within the second semiconductor nanocrystal,
wherein the first semiconductor nanocrystal comprises InZnP, and the second semiconductor nanocrystal comprises zinc, sulfur, and selenium, wherein the second semiconductor nanocrystal comprises a first shell layer and a second shell layer adjacent to the first shell layer, wherein a composition of the first shell layer is different from a composition of the second shell layer, and the second shell layer comprises the dopant, wherein the dopant comprises lithium, beryllium, magnesium, aluminum, gallium, boron, or a combination thereof, wherein the quantum dot composite exhibits a photoconversion efficiency greater than 57%, and does not include cadmium, and wherein the core does not include copper.

2. The display device of claim 1, wherein in the quantum dot, a molar ratio of sulfur with respect to selenium is greater than or equal to about 1 and less than or equal to about 4.

3. The display device of claim 1, wherein the shell further comprises a third shell layer disposed on the second shell layer, optionally as an outermost layer, and wherein the third shell layer comprises Zn and S.

4. The display device of claim 1, wherein the first shell layer comprises a third semiconductor nanocrystal and is disposed directly on the core, and wherein a bandgap energy of the third semiconductor nanocrystal is greater than a bandgap energy of the first semiconductor nanocrystal, and wherein the bandgap energy of the third semiconductor nanocrystal is less than a bandgap energy of the second semiconductor nanocrystal.

5. The display device of claim 4, wherein the third semiconductor nanocrystal is ZnSe, ZnTe, or a combination thereof.

6. The display device of claim 1, wherein in the shell, a molar ratio of sulfur with respect to selenium changes in a radial direction.

7. The display device of claim 1, wherein in the quantum dot, a molar ratio of sulfur with respect to selenium is less than or equal to about 1.5.

8. The display device of claim 1, wherein an amount of the dopant is less than or equal to about 0.3 mole with respect to 1 mole of Zn.

9. The display device of claim 1, wherein an amount of the dopant is less than or equal to about 0.1 mole with respect to 1 mole of Zn.

10. The display device of claim 1, wherein the quantum dot polymer composite comprises:

a polymer matrix; and the quantum dot dispersed in the polymer matrix.

11. The display device of claim 10, wherein the polymer matrix comprises a thiol-ene resin, a (meth)acrylate polymer, a urethane resin, an epoxy resin, a vinyl polymer, a silicone resin, or a combination thereof.

12. The display device of claim 1, wherein the quantum dot has an emission peak with a full width at half maximum of less than 40 nanometers, and wherein the quantum dot has a quantum yield of greater than or equal to 80%.

13. The display device of claim 1, wherein a photoconversion efficiency of the quantum dot polymer composite is greater than or equal to about 62%.

14. A display device, comprising:

a light source emitting a blue light; and a quantum dot polymer composite comprising a quantum dot, wherein a portion of the blue light is configured to be absorbed by the quantum dot, wherein the quantum dot comprises:

a core of InZnP, and a shell disposed on the core, wherein the shell comprises a first shell layer consisting of ZnSe, a second shell layer adjacent to the first shell layer, the second shell layer comprising ZnSeS and a dopant of aluminum or lithium, and a third shell layer disposed on the second shell layer, the third shell layer comprising ZnS, wherein the quantum dot has a particle size of greater than or equal about 2 nanometers and less than or equal to about 20 nanometers, and wherein the quantum dot composite exhibits a photoconversion efficiency greater than 57%, and does not include cadmium.

15. The display device of claim 14, wherein in the quantum dot, a mole ratio of the sulfur with respect to the selenium is greater than or equal to about 1 and less than or equal to about 3.

16. A display device, comprising:

a light source emitting a blue light; and a quantum dot polymer composite comprising a quantum dot, wherein a portion of the blue light is configured to be absorbed by the quantum dot, wherein the quantum dot comprises:

a core comprising a first semiconductor nanocrystal, and a shell disposed on the core, the shell comprising a second semiconductor nanocrystal and a dopant within the second semiconductor nanocrystal, and the second semiconductor nanocrystal comprises zinc, sulfur, and selenium, wherein the second semiconductor nanocrystal comprises a first shell layer and a second shell layer adjacent to the first shell layer, wherein a composition of the first shell layer is different from a composition of the second shell layer, and the second shell layer comprises a ZnSeS and the dopant, wherein the dopant comprises lithium, beryllium, magnesium, aluminum, gallium, boron, or a combination thereof, wherein the quantum dot composite exhibits a photoconversion efficiency greater than 57%, and does not include cadmium, and wherein the core does not include copper.

17. The display device of claim 16, wherein the Group III-V compound further comprises a Group II metal, a Group IV metal, or a combination thereof.

18. The display device of claim 16, wherein the first semiconductor nanocrystal comprises InP, InZnP, or a combination thereof.

19. The display device of claim 16, wherein the first semiconductor nanocrystal is InZnP.

20. The display device of claim 16, wherein the quantum dot polymer composite comprises:

a polymer matrix; and the quantum dot dispersed in the polymer matrix.

* * * * *